Jan. 4, 1966 M. BELIVEAU 3,226,810

APPARATUS FOR POSITIONING TRANSISTOR HEADER

Filed June 26, 1964 2 Sheets-Sheet 1

INVENTOR
MAURICE BELIVEAU

BY Robert W. Ely
ATTORNEY

Jan. 4, 1966 M. BELIVEAU 3,226,810

APPARATUS FOR POSITIONING TRANSISTOR HEADER

Filed June 26, 1964 2 Sheets-Sheet 2

United States Patent Office | 3,226,810
Patented Jan. 4, 1966

3,226,810
APPARATUS FOR POSITIONING TRANSISTOR HEADER

Maurice Beliveau, Poughkeepsie, N.Y., assignor to International Business Machines Corporation, New York, N.Y., a corporation of New York Filed June 26, 1964, Ser. No. 378,219
7 Claims. (Cl. 29—203)

Figure 1:
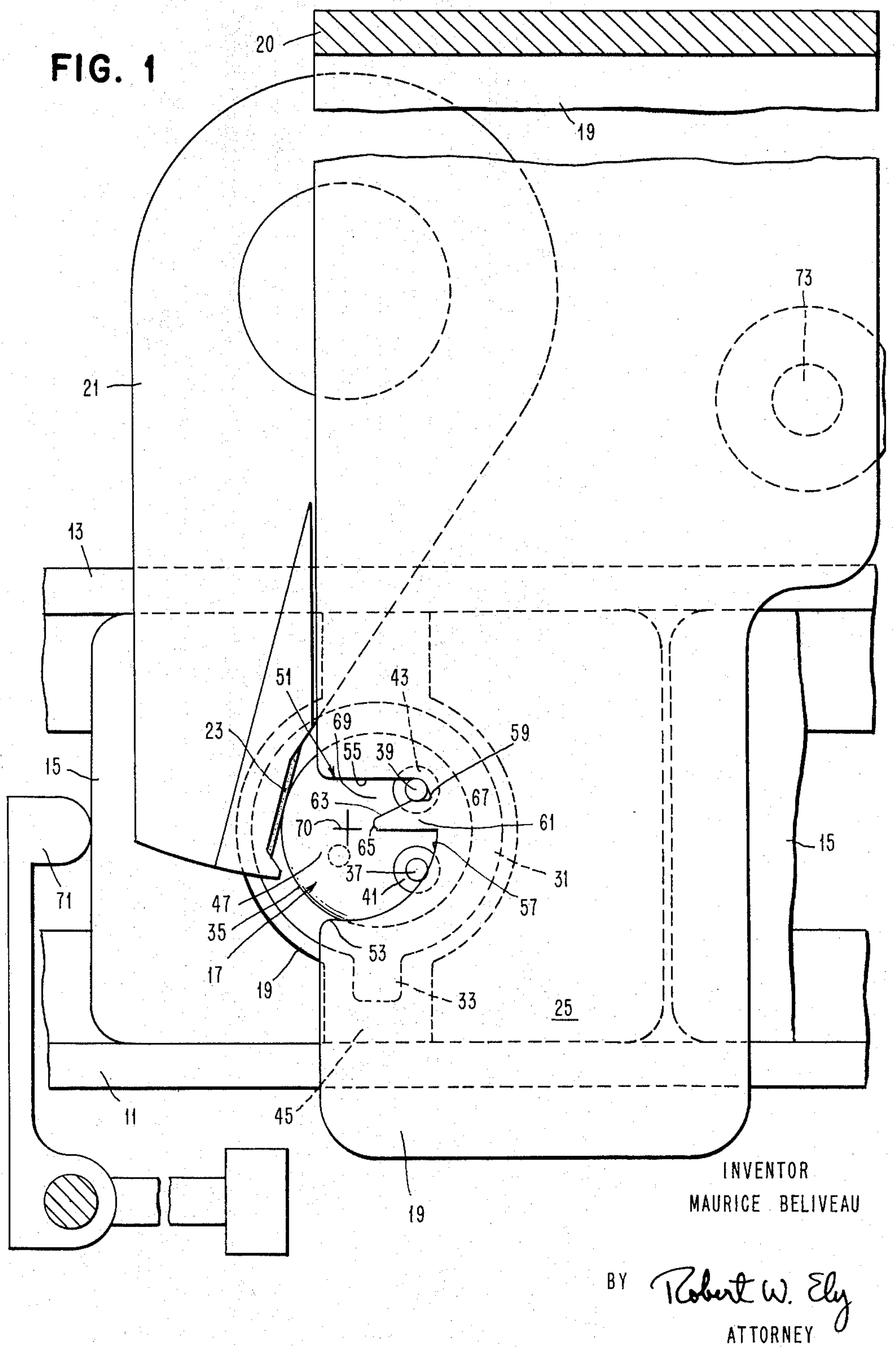

This invention relates to the manufacture of semiconductor devices and more particularly concerns apparatus for the positioning of the semi-conductor wafer or chip on the header.

In the prior method of manufacturing a transistor, a disk-like metallic header is formed with two posts projecting upwardly at one side from the top surface of the header. The small posts are part of two of the external transistor leads which are mounted in glass beads in the header. Next, the small semi-conductor wafer is bonded on the supporting header. It is important that this wafer be precisely positioned relaitve to the two posts, since the next operation involves pulling very thin connecting wires over the tops of transistor posts to the extremely small terminals on the wafer. The connecting wires are then bonded and cut by two heated, chisel-like instruments. Since the bonding-cutting machine operates with precise movements, the wafer must be accurately located relative to the posts. For example, the wafer or chip must be positioned within .001" relaitve to the two posts with a post tolerance of 0.20". This was accomplished by manually locating the wafer with a micromanipulator and microscope. With this method, it is apparent that production costs are high. Another approach was to tighten the tolerance on the post to post location but this results in greatly increased costs.

Another object of the present invention is to provide an improved apparatus for orienting a header so that a semiconductor chip can be accurately positioned relative to posts.

A further object is the provision of such apparatus which is inexpensive and avoids extensive operation time.

An additional object is to provide such apparatus which is simply constructed but reliable and accurate so that a reasonable tolerance as to post-post distance can be accepted and hence avoid high costs for headers.

Another object is the provision of such an apparatus which permits a rapid flow-through of headers with resulting low production costs.

In accordance with a particular form of the invention, a transistor header is relatively loosely mounted in support means and is moved into contact with orienting means. The orienting means has an opening with two arcuate surfaces which engage two lead posts of the transistor. One of the surfaces is at the bottom of a wide-entrance slot formed in part by a spoke so that rotational orientation is provided. The two surfaces are arcs of a common circle which is such that radii from the two arcuate surfaces intersect above the header with very close tolerance though the post-post tolerance may be relatively large. In other words, post spacing may vary but the chip location will be at the center of the arc. The point of intersection is thus accurately located for the next operation involving a chip-placing device which is fixed relative to the orienting means. An arm urges the header into the opening so that the posts reliably abut the arcuate surfaces.

Figure 2:
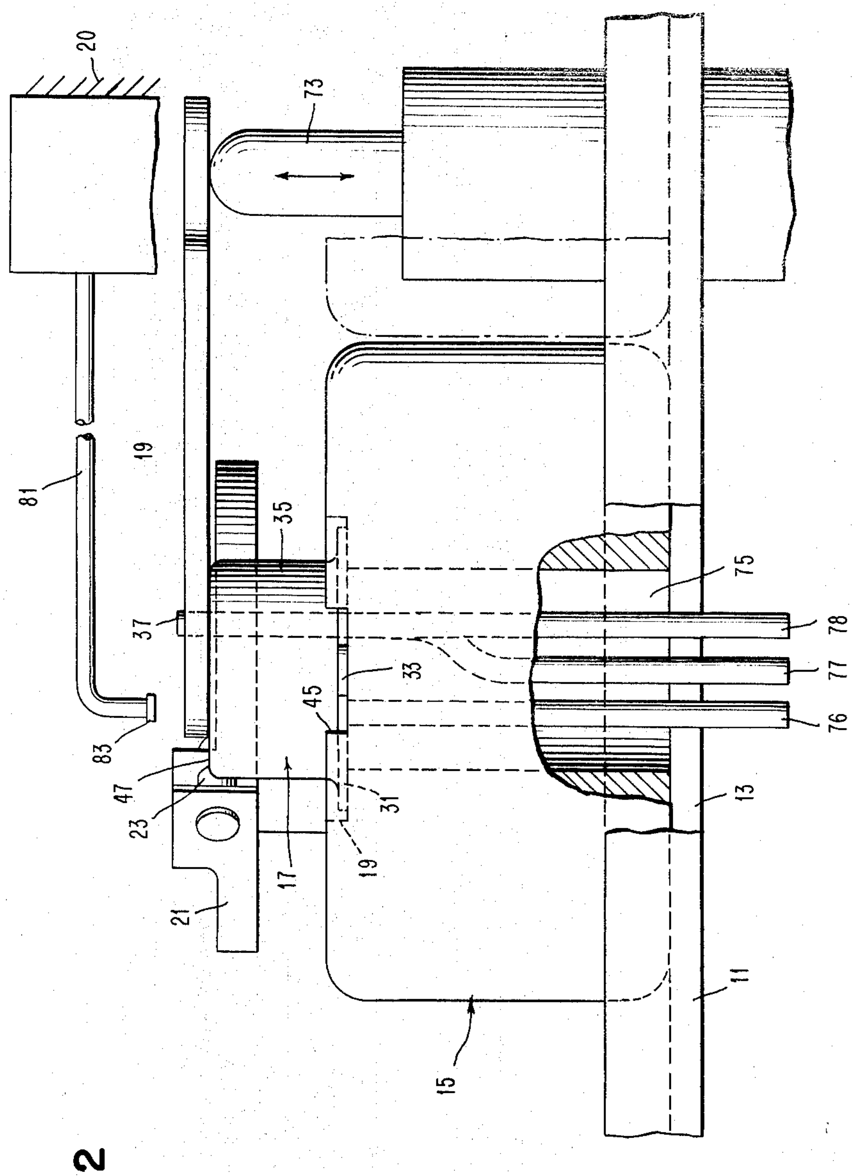

The realization of the above objects along with the features and advantages fo the invention will be apparent from the following description and the accompanying drawing in which:

FIGURE 1 is a top plane view of the orienting device and shows two small header posts engaging arcuate surfaces separated by a finger-like spoke and a pusher arm pivoted against the side of the header; and FIGURE 2 is a side elevation view and shows a header block in which the header is mounted and fixed means for placing a semiconductor chip.

Referring to FIGURE 1 of the drawing, two L-cross-sectioned convey tracks 11 and 13 support a relatively-large-mass, header carrier or rectangular block 15. The bottom of transistor header 17 is received in a larger diameter recess or counterbore 19 in metallic block 15. The side of the header 17 is urged toward and partially under a thin resilient strip or reed 19 (which is shown broken in being attached to fixed support 20) by a cam-driven pivot arm 21. This pusher arm 21 has a sapphire rod 23 contacting the side of the header. The left end 25 of the reed-like strip 19 overlays part of the top of the transistor header while the adjacent part of strip 19 overlays a portion of the pivot arm 21.

The transistor header 17 has a bottom flange 31 with a projecting tab 33, a cylindrical body section 35, and two posts 37 and 39 mounted in insulating glass beads 41 and 43. Tab 33 is loosely received in cross-channel 45 of block 15 so that there is no restriction to orienting the header. The header posts 37 and 39 projecting up from the top profile or surface 47 of the header are received in a side opening 51 of reed 19. Side opening 51 has two side edges 53 and 55 and two bottom arcuate surfaces 57 and 59 with spoke 61 therebetween. Spoke 61 has an inclined right edge 63 extending from its tip 65 and a short straight edge 67 both opposite the side edge 55 which is perpendicular to the long side edge of reed 19 to form a wide entrance slot 69 for post 39. The other straight side edge 53 of the opening 51 is relatively short and merges into the relatively long bottom arcuate surface 57. Surfaces 57 and 59 are on the arc of a common circle. The arc center is indicated by the cross 70.

With pivot arm 21 swung clear or rotated clockwise to the right, it is apparent that header 17 in block 15 can be moved by cam-operated bell crank 71 or other suitable means so that post 39 is received in slot 51 to closely approach arcuate surface 59 and so that post 37 is adjacent to arcuate surface 57. Final abutment results when pivot arm 21 is rotated counterclockwise to contact the side of the header. A cam-operated button 73 is provided below reed 19 adjacent the lower right, exposed part of track 13 to lift reed 19 for clearing posts 37 and 39 to permit forward movement of the header 17 after a wafer or chip has been placed on, and bonded to, the oriented header.

It is to be noted that the posts 37 and 39 are in contact with two surfaces 57 and 59 which are on the arc of a common circle. The radii from the arc at the post contacts will intersect at 70 to provide a chip location which will be repetitively accurate although the post-to-post tolerance is relatively large.

Referring to FIGURE 2, it is to be noted that the header tab 33 and flange 31 are loosely received respectively in slot 45 and circular recess 19. The crystalline-type rod 23 (sapphire, diamond or tungsten carbide) of pivot arm 21 abuts the top side of the header body 35. The relative mass of the header carrier block 15 is apparent and serves as a heat sink for bonding. Block 15 has an opening 75 for the three transistor leads 76, 77 and 78, the latter two being parts of posts 37 and 39. It is clear that reed 19 can be lifted by button 73 to clear the relatively short posts 37 and 39.

A cam-operated, spring-biased, suction pick-up arm 81 fixed to, or relative to, the orienting means support 20 is provided and is constructed and arranged to pick up a wafer or chip 83 having small terminals (not shown), to move into a precise location or point over header surface 47 and then to move down to place the chip 83 at cross 70 on top surface 47 of header 17 with a small downward force. The arm 81 momentarily dwells and then releases the chip 83 and moves up and outward.

Referring to FIGURE 1, it can be seen that the chip 83 will be placed at arc center 70 and that this location is within the top profile 47 of the header and is spaced appreciably from the peripheral edge of the header. It is also spaced equally and appreciably from the two posts 37 and 39. Spoke 61 terminates an appreciable distance from arc center 70 to facilitate placing of the semiconductor wafer 83.

In operation with reference to FIGURES 1 and 2, an operator loads headers 17 into a plurality of blocks 15. The loaded blocks 15 are moved through a furnace for heating and then onto the tracks 11 and 13 by suitable means, such as a bell-crank device 71, for giving periodic movement to the train of blocks. As one of the blocks (with a header loosely received therein) moves toward the orienting means, the pusher pivot arm 21 will be rotated to clear the header 17. The tab 33 in slot 45 of block 15 gives an approximate rotational orientation so that the right post 39 enters the wide-entrance slot 51 and is guided to the proximity of short arcuate surface 59. The other post 37 will engage or approach the large arcuate surface 57. The control means (not shown) will cam-drive the pivot arm 21 so that its sapphire rod 23 engages the upper side surface of the header 17 and urges the posts 37 and 39 respectively against the arcuate surfaces 57 and 59. It is apparent that slot 51 gives proper rotational orientation and that two radii extending from the contact points of each of the arcuate surfaces through round posts 37 and 39 will intersect above the header top surface 47 at a point which for example can be predictable within .001" although the posts may differ in spacing as much as .020". The intersecting point 70 will thus be relatively fixed with reference to the posts to give proper positioning of the semiconductor chip 83 by means of suction pick-up arm 81. Chip 83 has a gold film evaporated on its bottom surface. This arm will deposit the chip 83 at the intersecting point so that it is soldered to gold-plated, header top 47 (heated by the block 15) and thus properly located for whisker wire attachment to the chip and posts. After pick-up arm 81 is lifted and retracted by the control means, the pivot arm 21 will be rotated clear and the reed 19 will be lifted clear of the posts by cam-operated button 73. After the posts 37 and 39 clear the reed 19, the end of reed 25 will return to horizontal position with retraction of button 73. The orienting means is then ready to receive another header for orientation and the accurate locating of its semiconductor chip by suction arm 81.

It is to be understood that persons skilled in the art can make changes in the disclosed device without departing from the spirit and scope of the invention.

What is claimed is:

1. Apparatus for establishing a location for a semiconductor wafer relative to first and second projections of a header having a bottom part comprised of:
- support means having a recess for receiving the bottom part of a semiconductor header;
- orienting means having a first surface adapted to contact a first header projection and a second surface adapted to contact a second header projection; and
- said first and second surfaces being arranged on the arc of a common circle so that radii extending from the two points of contact intersect within the top profile of the header at a location spaced appreciably from the peripheral edge and equally and appreciably from the two projections, whereby a semiconductor wafer can be placed at the location by means which is fixed relative to the orienting means.

2. The apparatus of claim 1 and being further characterized by:
- contact means arranged to urge the semiconductor header so that said projections are against said first and second surfaces; and
- said orienting means including structure having a slot for receiving one of said projections.

3. The apparatus of claim 2 and being further characterized by:
- said contact means being a pivot arm rotatable to a position opposite said surfaces of said orienting means and having a crystalline rod adapted to contact said header; and
- said orienting means including a thin resilient strip having said surfaces and said slot and further including a button adapted to bend said strip to clear said header.

4. The apparatus of claim 1 and being further characterized by:
- said orienting means including a thin strip having a side opening adapted to receive a post of a semiconductor device;
- said opening having a first side end edge, a second side edge and first and second arcuate bottom edges and a spoke therebetween;
- said first side edge being perpendicular to the side edge of the strip;
- said spoke extending parallel to said first side edge and having opposite thereto an inclined edge to provide a wide-entrance slot for a header post; and
- said spoke terminating an appreciable distance from the intersection of said radii.

5. Apparatus for positioning a semiconductor wafer on a header having two projections and a bottom part comprised of:
- support means having a recess for receiving the bottom part of a semiconductor header;
- orienting means having a first surface adapted to contact one header projection and a second surface adapted to contact the other header projection;
- said first and second surfaces being arranged on the arc of a common circle so that radii extending from the two points of contact intersect within the top profile of the header at a location spaced appreciably from the peripheral edge and the two projections; and
- locating means for a semiconductor wafer fixed relative to said orienting means and adapted to be positioned precisely over the intersection of said radii, whereby the wafer can be located accurately in relation to the header projections which may vary slightly as to relative spacing.

6. The apparatus of claim 5 and being further characterized by:
- said locating means being a vacuum pick device having a tubular suction arm for carrying a wafer and operating means for positioning the suction arm so that the carried wafer is moved against said header at said radii intersection.

7. The apparatus of claim 5 and being further characterized by:
- said support means including two side tracks of L-cross section and a block of a relatively large mass having said header recess.

References Cited by the Examiner

UNITED STATES PATENTS

| | | | |
|---|---|---|---|
| 3,102,331 | 9/1963 | Da Costa | 29—203 |
| 3,131,464 | 5/1964 | Weigel | 29—203 |
| 3,151,387 | 10/1964 | Clemens et al. | 29—203 |

WHITMORE A. WILTZ, *Primary Examiner*.